United States Patent [19]

Takebe

[11] Patent Number: 5,191,237
[45] Date of Patent: Mar. 2, 1993

[54] FIELD-EFFECT TRANSISTOR TYPE SEMICONDUCTOR SENSOR

[75] Inventor: Katuhiko Takebe, Tokyo, Japan

[73] Assignee: Honda Giken Kogyo Kabushiki Kaisha, Tokyo, Japan

[21] Appl. No.: 749,220

[22] Filed: Aug. 23, 1991

[30] Foreign Application Priority Data

Aug. 24, 1990 [JP] Japan ................. 2-223322

[51] Int. Cl.$^5$ .................. H03K 3/00; H01L 29/66
[52] U.S. Cl. .................. 257/419; 307/261; 307/278; 307/304; 73/777; 73/754; 257/254; 257/415
[58] Field of Search .................. 357/25, 26, 23.13, 55, 357/41; 307/278, 304, 308, 261, 362; 73/715, 720, 727, 754, 777

[56] References Cited

U.S. PATENT DOCUMENTS

| | | | |
|---|---|---|---|
| 3,582,690 | 6/1971 | Yerman | 307/308 |
| 4,275,406 | 6/1981 | Müller et al. | 357/26 |
| 4,576,052 | 3/1986 | Sugiyama | 73/727 |
| 4,633,099 | 12/1986 | Tanabe et al. | 307/308 |
| 4,670,969 | 6/1987 | Yamada et al. | 357/26 |
| 4,706,100 | 11/1987 | Tufte | 357/26 |
| 4,961,833 | 10/1990 | Sakai et al. | 357/25 |

FOREIGN PATENT DOCUMENTS

| | | | |
|---|---|---|---|
| 58-105029 | 6/1983 | Japan | 73/727 |
| 2-100372 | 4/1990 | Japan | 357/26 |
| 2-218171 | 8/1990 | Japan | 357/26 |

Primary Examiner—Rolf Hille
Assistant Examiner—Minhloan Tran
Attorney, Agent, or Firm—Merchant, Gould, Smith, Edell, Welter & Schmidt

[57] ABSTRACT

A semiconductor sensor for detecting physical quantities such as pressure, acceleration, mechanical vibration, etc. includes a semiconductor substrate, and a field-effect transistor on the semiconductor substrate, the field-effect transistor having a source, a drain, and a gate. A gate voltage is between the source and the gate to cause a drain current between the source and the drain, the drain current being variable with an external force applied to the field-effect transistor, whereby the external force can be detected on the basis of a change in the drain current. The drain current which flows when no external force is applied to the field-effect transistor is selected to be ⅓ or less of a drain current which flows when the gate and the source are shorted, or to be in the vicinity of a value that maximizes the ratio of a change in the drain current which flows when the external force is applied to the field-effect transistor to a change in the drain current which flows when no external force is applied to the field-effect transistor.

8 Claims, 3 Drawing Sheets

FIELD-EFFECT TRANSISTOR TYPE SEMICONDUCTOR SENSOR

BACKGROUND OF THE INVENTION

1. Field of the Invention

The present invention relates to a semiconductor sensor for detecting physical quantities such as pressure, acceleration, mechanical vibration, etc.

2. Description of the Relevant Art

There is known a semiconductor sensor which comprises a field-effect transistor on a piezoelectric semiconductor substrate. While a drain current is flowing with a gate voltage applied to the gate of the field-effect transistor, an external force applied to the field-effect transistor can be detected on the basis of a change in the drain current or a drain voltage.

Since the output signal indicative of the applied external force is higher as the drain current is larger, it has been customary to select a gate bias voltage for higher external force sensitivity such that the drain current will be of a large value when no external force is applied.

However, it has experimentally found that the larger drain current for the higher output signal results in a reduction in the accuracy of the output signal. This is because as the drain current increases, the noise current generated by the field-effect transistor itself increases, thereby degrading the ratio of the output signal to the noise (signal-to-noise ratio).

SUMMARY OF THE INVENTION

In view of the aforesaid problem of the conventional semiconductor sensor, it is an object of the present invention to provide a semiconductor sensor capable of producing an output signal of high signal to-noise ratio.

According to the present invention, a semiconductor sensor for detecting physical quantities such as pressure, acceleration, mechanical vibration, etc. includes a semiconductor substrate, and a field-effect transistor on the semiconductor substrate, the field-effect transistor having a source, a drain, and a gate. A gate voltage is between the source and the gate to cause a drain current between the source and the drain, the drain current being variable with an external force applied to the field-effect transistor, whereby the external force can be detected on the basis of a change in the drain current. The drain current which flows when no external force is applied to the field-effect transistor is selected to be ⅓ or less of a drain current which flows when the gate and the source are shorted, or to be in the vicinity of a value that maximizes the ratio of a change in the drain current which flows when the external force is applied to the field effect transistor to a change in the drain current which flows when no external force is applied to the field-effect transistor.

The above and further objects, details and advantages of the present invention will become apparent from the following detailed description of preferred embodiments thereof, when read in conjunction with the accompanying drawings.

DETAILED DESCRIPTION OF THE PREFERRED EMBODIMENTS

Figure 1:
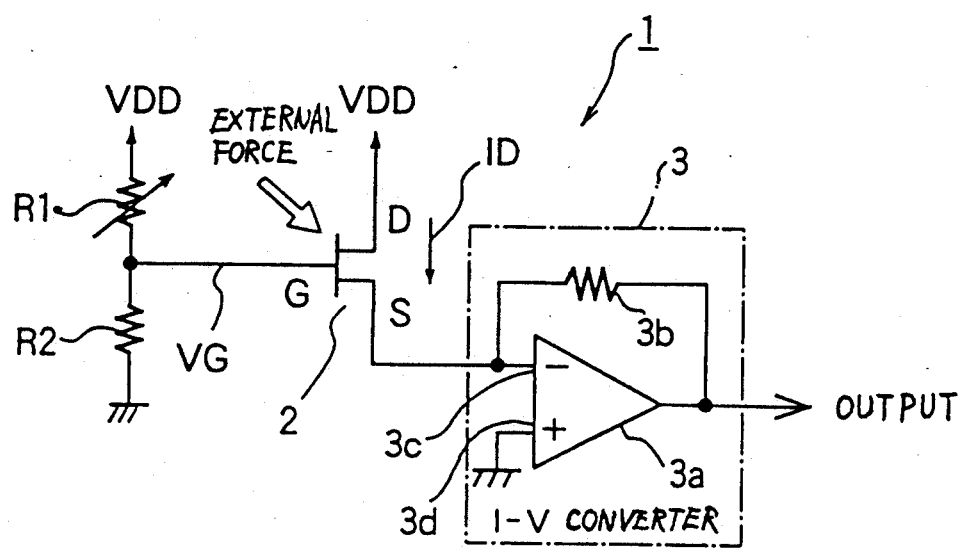
FIG. 1 is a circuit diagram of a semiconductor sensor according to an embodiment of the present invention.

FIG. 1 shows a semiconductor sensor according to an embodiment of the present invention. The semiconductor sensor, generally designated by the reference numeral 1, comprises a field-effect transistor (FET) 2 whose drain current $I_{DS}$ varies with a physical quantity applied thereto as an external force, such as a pressure, an acceleration, a mechanical vibration, or the like, a current to-voltage (I-V) converter 3 for producing a voltage corresponding to the drain current $I_{DS}$ of the FET 2, variable and fixed resistors R1, R2 for applying a predetermined gate bias voltage $V_{GS}$ to the gate G of the FET 2, and a power supply $V_{DD}$. The drain D of the FET 2 is connected to the power supply $V_{DD}$. The gate bias voltage $V_{GS}$ applied to the gate G of the FET 2 is produced by dividing the voltage of the power supply $V_{DD}$ with the resistors R1, R2.

The current-to-voltage converter 3 comprises an operational amplifier 3a and a feedback resistor 3b connected across said operational amplifier 3a. The source S of the FET 2 is connected to an inverting input terminal 3c of the operational amplifier 3a, with its noninverting input terminal 3d connected to ground. Based on the potential difference, which is being substantially zero, between the input terminals 3c, 3d, with the input terminal 3d at the ground potential, the FET 2 is energized with a constant voltage applied between the drain D and the source S thereof.

The resistance of the resistor R1 is adjusted to adjust the base bias voltage $V_{GS}$ such that the drain current $I_{DS}$ of the FET 2 which flows when an external force (indicated by the arrow) is not applied to the FET 2 is ⅓ or less of a drain current $I_{DSS}$ which flows when the gate G and the source S are shorted. Instead of the current-to-voltage converter 3, a load resistor may be connected between the source S of the FET 2 and ground for directly extracting an output voltage from the source S of the FET 2.

Figure 2:
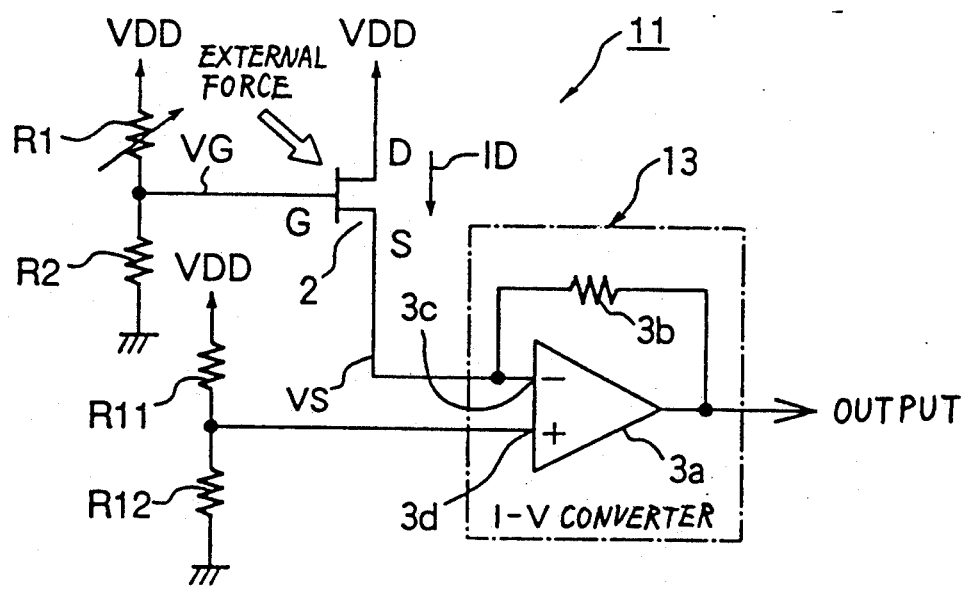
FIG. 2 is a circuit diagram of a semiconductor sensor according to another embodiment of the present invention.

FIG. 2 shows a semiconductor sensor 11 according to another embodiment o the present invention. The semiconductor sensor 11 differs from the semiconductor sensor 1 shown in FIG. 1 in that a voltage which is produced by dividing the voltage from the power supply VDD with resistors R11, R12 is applied to the non-inverting input terminal 3d of the operational amplifier 3a of the current-to-voltage converter 13. The voltage $V_G$ applied to the gate G of the FET 2 is determined by the resistors R1, R2, and the source voltage $V_S$ of the FET 2 is determined by the resistors R11, R12, for controlling the gate-to-source voltage $V_{GS}$ of the FET 2 to adjust the drain current $I_{DS}$.

The drain current $I_{DS}$ which flows when no external force is applied is selected such that the ratio (S/N) of a change S in the drain current (output current) at the time an external force is applied to a change N in the drain current (noise current) at the time no external force is applied is large.

The structural details of semiconductor sensors will be described below with reference to FIGS. 3 and 4.

Figure 3:
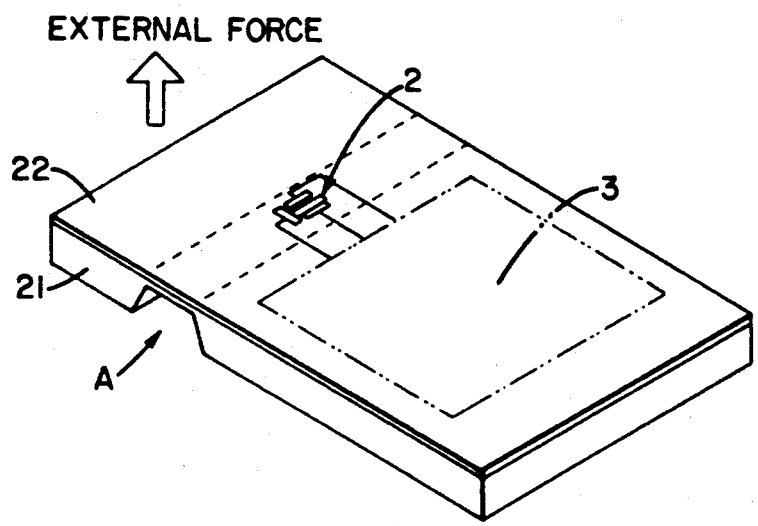
FIG. 3 is a perspective view of a cantilever-type semiconductor sensor.

FIG. 3 shows a cantilever-type semiconductor sensor that is suitable for detecting a strain-dependent stress, an acceleration, or the like. The semiconductor sensor 1 shown in FIG. 1 or the semiconductor sensor 11 shown in FIG. 2 may be fabricated as the cantilever-type semiconductor sensor shown in FIG. 3. In FIG. 3, a crystal layer 22 of gallium arsenide (GaAs), for example, is deposited on a semiconductor substrate 21 of silicon (Si), for example, by way of epitaxial growth. A lower portion of the semiconductor substrate 21, which is of a rectangular shape, is etched away or otherwise removed to form a straight groove (indicated by the dotted line) parallel to one side of the semiconductor substrate 21, thereby leaving a thin layer A that is thinner than the remainder of the semiconductor substrate 21. The FET 2 is fabricated in the crystal layer 22 and the thin layer A.

The FET 2 may comprise a junction FET (J-FET), a MES-FET, a MIS-FET, or a HEMT.

In operation, one end of the semiconductor substrate 2 is fixed to a stationary member. When an external force is applied to the other free end of the semiconductor substrate 2 in the transverse direction thereof, the crystal layer 22 on the thin layer A is flexed. The drain current $I_{DS}$ of the FET 2 now varies due to the stress caused by the flexing of the crystal layer 22. The current-to-voltage converter 3 may be formed in the crystal layer 22 in a region other than the thin layer A.

Figure 4:
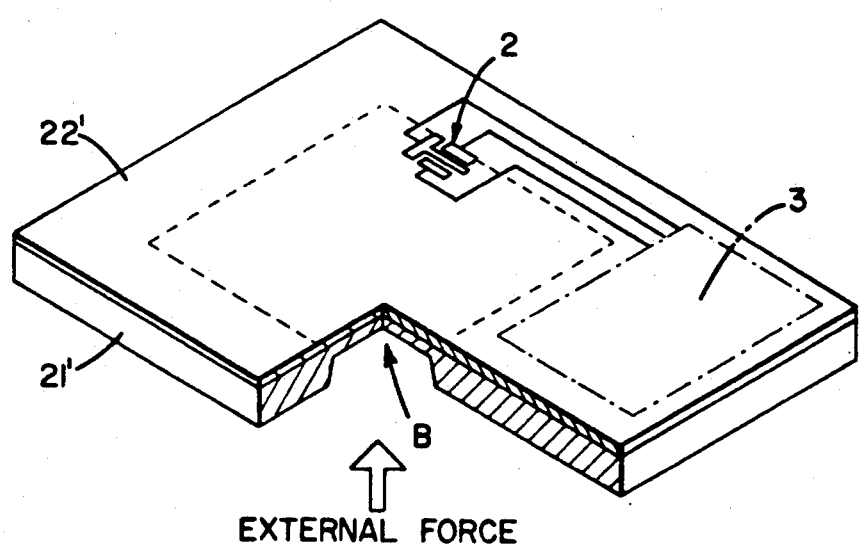
FIG. 4 is a perspective view of a diaphragm-type semiconductor sensor.

FIG. 4 shows a diaphragm-type semiconductor sensor that is suitable for detecting a pressure or the like. The semiconductor sensor 1 shown in FIG. 1 or the semiconductor sensor 11 shown in FIG. 2 may be fabricated as the diaphragm-type semiconductor sensor shown in FIG. 3. In FIG. 4, a crystal layer 22' of gallium arsenide (GaAs), for example, is deposited on a semiconductor substrate 21' of silicon (Si), for example, by way of epitaxial growth. A lower portion of the semiconductor substrate 21, which is of a rectangular shape, is etched away or otherwise removed to form a central recess (indicated by the dotted line), thereby leaving a thin layer B of the semiconductor substrate 21'. The FET 2 is fabricated in the crystal layer 22' and the thin layer B.

Figure 5:
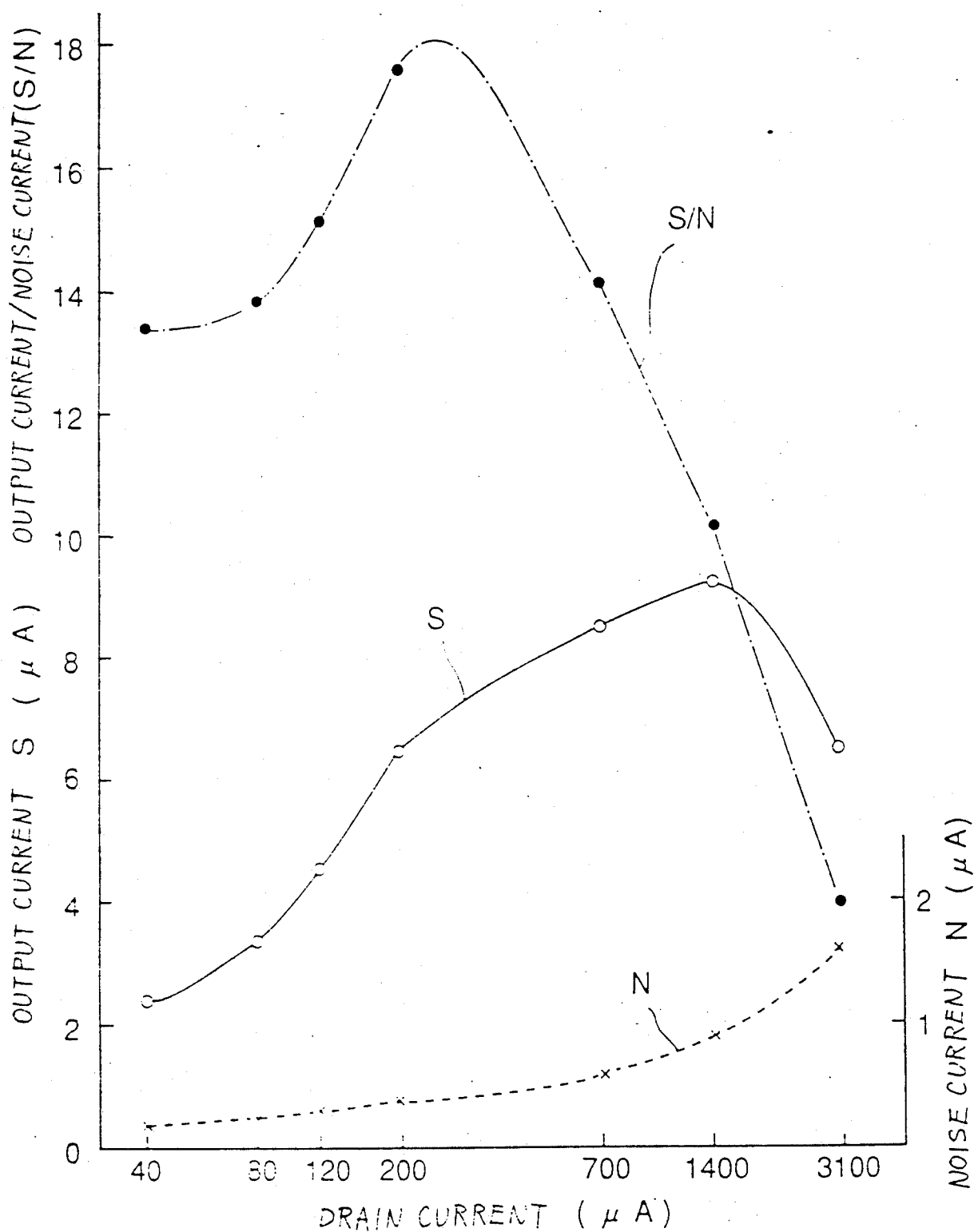
FIG. 5 is a graph showing an output current and a noise current as they are plotted against a drain current.

FIG. 5 shows an output current, indicative of a detected external force applied to the semiconductor sensor, and a noise current, the output current and the noise current being plotted against the drain current. More specifically, in the circuit shown in FIG. 1, a voltage of 1.5 V was applied to the drain D of the GaAs FET 2 whose drain current $I_{DSS}$ is 3.6 mA, and while the drain-to source voltage $V_{DS}$ was being kept constant, the resistance of the variable resistor R1 varied to vary the gate voltage $V_{GS}$ thereby varying the drain current $I_{DS}$. While the drain current $I_{DS}$ was being varied, an output current S (i.e., a change in the drain current) produced when an external force of $2 \times 10^{16}$ dyne/cm$^2$ was applied and a noise current N (i.e., a change in the drain current) produced when no external force was applied were measured, and the ratio S/N was calculated. The horizontal axis of the graph of FIG. 5 represents the drain current $I_{DS}$. The solid-line curve represents the output current S, the dotted-line curve represents the noise current N, and the one-dot-and-dash-line curve represents the ratio S/N. The output current S and the noise current N are converted from the output voltage of the current-to voltage converter 13.

As the drain current $I_{DS}$ increases, the noise current N also increases. Since the output current S does not increase in proportion to the drain current $I_{DS}$, if the drain current $I_{DS}$ were about 1/10 or more of the drain current $I_{DSS}$, then the ratio S/N would be impaired.

According to the present invention, the drain current $I_{DS}$ is selected to be ⅓ or less of the drain current $I_{DSS}$, i.e., 1.2 mA or less in FIG. 5, or to be in the vicinity of a value that maximizes the ratio S/N of the output current S to the noise current N. Therefore, the output current S which is produced by the semiconductor sensor according to the present invention is highly accurate as it is less susceptible to the noise current N.

Although there have been described what are at present considered to be the preferred embodiments of the invention, it will be understood that the invention may be embodied in other specific forms without departing from the essential characteristics thereof. The present embodiments are therefore to be considered in all respects as illustrative, and not restrictive. The scope of the invention is indicated by the appended claims rather than by the foregoing description.

I claim:

1. A field-effect transistor-type semiconductor sensor comprising:

a semiconductor substrate;

a field-effect transistor on said semiconductor substrate, said field-effect transistor having a source, a drain, and a gate;

means for applying a gate voltage between said source and said gate to cause a drain current between said source and said drain, said drain current being changeable with an external force applied to said field-effect transistor in comparison with a drain current, which flows when no external force is applied thereto, said external force being detectable by detecting a change in the drain current; and said gate voltage applying means being capable of adjustably controlling the drain current, which flows when no external force is applied to said field-effect transistor, to be ⅓ or less than ⅓ of a drain current which flows when said gate and said source are shorted.

2. A semiconductor sensor according to claim 1, further including a current-to-voltage converter connected to said field-effect transistor, for converting the drain current into a voltage representing the external force applied to said field-effect transistor.

3. A semiconductor sensor according to claim 2, wherein said current-to-voltage converter comprises an operational amplifier having an inverting input terminal and a noninverting input terminal and a feedback resistor connected across said operational amplifier, said inverting input terminal being connected to said source, said non-inverting input terminal being grounded.

4. A semiconductor sensor according to claim 2, wherein said current-to-voltage converter comprises an operational amplifier having an inverting input terminal and a noninverting input terminal and a feedback resistor connected across said operational amplifier, said inverting input terminal being connected to said source, said non-inverting input terminal being grounded through a resistor and also connected to a power supply through a resistor.

5. A semiconductor sensor according to claim 1, wherein said semiconductor substrate comprises a silicon substrate, said silicon substrate including a thin layer which is thinner than the remainder of the silicon substrate, further including a crystal layer deposited on said silicon substrate by way of epitaxial growth, said field-effect transistor being formed in said thinner layer of the silicon substrate and said crystal layer.

6. A semiconductor sensor according to claim 5, wherein said thin layer is defined by a straight groove in said silicon substrate.

7. A semiconductor sensor according to claim 5, wherein said thin layer is defined centrally in said silicon substrate.

8. A field-effect transistor-type semiconductor sensor comprising:

a semiconductor substrate;

a field-effect transistor on said semiconductor substrate, said field-effect transistor having a source, a drain, and a gate;

means for applying a gate voltage between said source and said gate to cause a drain current between said source and said drain, said drain current being changeable with an external force applied to said field-effect transistor in comparison with a drain current, which flows when no external force is applied thereto, said external force being detectable by detecting a change in the drain current; and said gate voltage applying means being capable of adjustably controlling the drain current, which flows when no external force is applied to said field-effect transistor, to approach a value that maximizes a ratio of a change in the drain current, which flows when the external force is applied to said field-effect transistor, to a change in the drain current which flows when no external force is applied to said field-effect transistor.

* * * * *